United States Patent [19]

Moriyoshi et al.

[11] Patent Number: 4,981,671

[45] Date of Patent: Jan. 1, 1991

[54] METHOD FOR PREPARING DIAMOND OR DIAMOND-LIKE CARBON BY COMBUSTION FLAME

[75] Inventors: Yusuke Moriyoshi, Tokyo; Masatsugu Futaki, Urawa; Seiichiro Matsumoto, Tsukuba; Takamasa Ishigaki, Tsukuba; Shojiro Komatsu, Tsukuba; Nobuo Setaka, Nagareyama, all of Japan

[73] Assignee: National Institute for Research in Inorganic Materials, Tsukuba, Japan

[21] Appl. No.: 307,942

[22] Filed: Feb. 9, 1989

[30] Foreign Application Priority Data

Feb. 9, 1988 [JP] Japan .................................. 63-28133
Apr. 13, 1988 [JP] Japan .................................. 63-91015

[51] Int. Cl.$^5$ .............................................. C01B 31/06
[52] U.S. Cl. ...................................... 423/446; 427/39; 561/86; 156/DIG. 68
[58] Field of Search .......................... 423/446; 427/39; 501/86; 156/DIG. 68

[56] References Cited

U.S. PATENT DOCUMENTS

| 3,030,187 | 4/1962 | Eversole | 423/446 |
| 3,630,677 | 12/1971 | Angus | 423/446 |
| 3,705,937 | 12/1972 | Dzevitsky et al. | 423/446 |
| 3,714,334 | 1/1973 | Vickery | 423/446 |
| 3,749,760 | 7/1973 | Deryagin et al. | 423/446 |
| 4,816,286 | 3/1989 | Hirose | 423/446 |

FOREIGN PATENT DOCUMENTS

| 62-171995 | 7/1987 | Japan | 423/446 |
| 62-235295 | 10/1987 | Japan | 501/86 |

Primary Examiner—Olik Chaudhuri
Assistant Examiner—Robert M. Kunemund
Attorney, Agent, or Firm—Oblon, Spivak, McClelland, Maier & Neustadt

[57] ABSTRACT

A method for preparing diamond or diamond-like carbon, which comprises exciting carbon by decomposing, evaporating and dissociating an organic compound or a carbon material in a combustion flame of at least 600° C. of a hydrocarbon, hydrogen or a mixture thereof and oxygen gas or air, mixing thereto hydrogen in an amount of at least one time by volume the amount of carbon, and maintaining the mixture at a temperature of from 600° to 1,700° C. to precipitate diamond or diamond-like carbon.

4 Claims, 1 Drawing Sheet

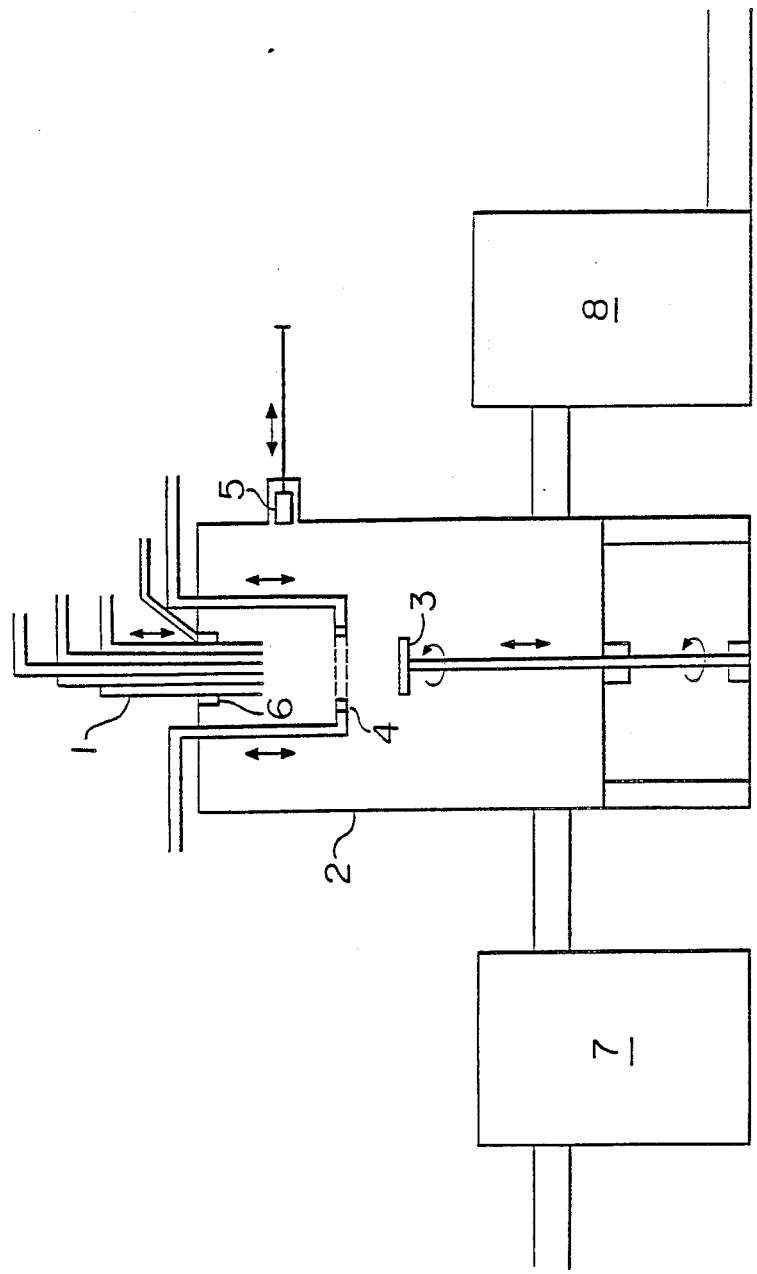

METHOD FOR PREPARING DIAMOND OR DIAMOND-LIKE CARBON BY COMBUSTION FLAME

BACKGROUND OF THE INVENTION

1. Field of the Invention

The present invention relates to a method for preparing diamond or diamond-like carbon by using a combustion flame. The diamond or diamond-like carbon is useful as grinding material to form a flat surface or as abrasion resistant materials.

2. Discussion of Background

Heretofore, the following methods are known for the preparation of diamond by vapor phase synthesis which does not require a high temperature or high pressure.

(1) A so-called ion beam vapor deposition or ion plating method wherein carbon ions or hydrocarbon ions are formed by electric discharge, and they are accelerated by potential gradient to impinge on a substrate to precipitate diamond thereon.

(2) A so-called plasma method, heated tungsten filament method, photo-CVD method, high frequency heat plasma method or direct current arc method, wherein a gas mixture of a hydrocarbon and hydrogen is activated by means of a plasma, heat or light to precipitate diamond on the surface of a substrate.

However, with such methods except for the high frequency heat plasma method and the direct current arc method, the diamond-forming rate is as low as from 0.1 to 1 $\mu m/hr$, and the area for precipitation of diamond is small. Besides, the apparatus are very expensive. Whereas, the high frequency heat plasma method and the direct current arc method have a drawback that the apparatus are extremely expensive, although the diamond-forming rate is high at a level of a few $\mu m/min$.

SUMMARY OF THE INVENTION

It is an object of the present invention to solve the problems inherent to the above-mentioned conventional methods and to provide a method for preparing diamond or diamond-like carbon at its forming rate as high as a few $\mu m/min$ by a simple and inexpensive apparatus.

As a result of extensive researches to accomplish the above object, the present inventor has succeeded to precipitate diamond by exciting carbon by decomposing, evaporating and dissociating an organic compound or a carbon material in a high temperature combustion flame of at least 600° C. obtained by the combustion of a hydrocarbon, hydrogen or a mixture thereof and oxygen or air, mixing thereto hydrogen in an amount of at least 50 times by volume the amount of carbon, and maintaining the resulting gas mixture at a temperature of from 600° to 1,200° C. It has been found that according to this method, diamond can be prepared at a forming rate of from 0.1 to a few $\mu m/min$. From a further research, it has been further found that depending upon the amount of hydrogen mixed with excited carbon, a product composed mainly of diamond-like carbon can be obtained, and the amount of hydrogen for this purpose is from 1 to 40 times by volume the amount of carbon. Further, it has been found that diamond-like carbon can be prepared within a wide temperature range of from 600° to 1,700° C. The present invention is based on these discoveries.

Thus, the present invention provides a method for preparing diamond or diamond like carbon, which comprises exciting carbon by decomposing, evaporating and dissociating an organic compound or a carbon material in a combustion flame of at least 600° C. of a hydrocarbon, hydrogen or a mixture thereof and oxygen gas or air, mixing thereto hydrogen in an amount of at least one time by volume the amount of carbon, and maintaining the mixture at a temperature of from 600° to 1,700° C. to precipitate diamond or diamond-like carbon.

The diamond or diamond-like carbon may be precipitated in a gas phase at a temperature of from 600° to 1,700° C. or on a substrate by blowing the mixture of excited carbon and hydrogen against the substrate heated at a temperature of from 600° to 1,700° C.

In this invention, "diamond-like carbon" is meant for a product having carbon-carbon bonds such as $SP^3$, $SP^2$ or double-bond.

BRIEF DESCRIPTION OF THE DRAWING

In the accompanying drawing, FIG. 1 is a diagrammatical view of an apparatus used for carrying out the method of the present invention.

DETAILED DESCRIPTION OF THE PREFERRED EMBODIMENTS

In the method of the present invention, the organic compound or the carbon material may be decomposed, evaporated and dissociated in a high temperature combustion flame either by generating a high temperature combustion flame and introducing the organic compound or the carbon material thereinto, or introducing the organic compound or the carbon material simultaneously with the combustion material.

As the gas for generating the high temperature combustion flame of the present invention, a hydrocarbon, hydrogen or a mixture thereof and oxygen or air, are used. The temperature of the combustion flame can be controlled by selecting the type and concentration of the gas to be used, or by introducing sheath gas or cooling gas such as hydrogen, an inert gas or a gas mixture thereof. The temperature of the combustion flame is required to be at least 600° C. If the temperature is lower than 600° C., single atoms of carbon hardly form, and diamond or diamond-like carbon can hardly be synthesized.

The organic compound may be in the form of either gas, liquid or solid so long as it is decomposed by the combustion and capable of forming ion species or radical species including carbon. For example, it may be a hydrocarbon such as methane, ethane, propane, butane, ethylene or benzene, an alcohol such as methanol, ethanol or propanol, a polymer substance such as polyethylene or polypropylene, fat and oil, or a compound containing nitrogen or sulfur in its molecule such as pyridine or thiophene.

As the carbon material, graphite may, for example, be mentioned.

Into the excited carbon atmosphere, hydrogen is introduced in an amount of from 1 to 45 times by volume relative to the carbon to obtain diamond-like carbon, or in an amount of at least 50 times, preferably from 50 to 100 times, by volume relative to the carbon to obtain diamond. This hydrogen stabilizes single atoms of carbon and maintains the excited state of $SP^3$. If the amount of hydrogen is less than 1 time by volume relative to the carbon, the product tends to be graphite.

If the amount of hydrogen exceeds 45 times by volume, the product will be composed mainly of diamond. Therefore, in order to obtain diamond-like carbon, the amount of hydrogen is preferably within a range of from 1 to 45 times by volume the amount of carbon. Likewise, in order to obtain diamond, the amount of hydrogen is preferably at least 50 times by volume, more preferably from 50 to 100 times by volume, the amount of carbon.

The temperature for precipitation of diamond or diamond-like carbon i.e. the temperature of the substrate or the temperature of the gas phase, is from 600° to 1,700° C. If the temperature is lower than 600° C., the product will be graphite. On the other hand, if the temperature exceeds 1,700° C., the product will be gaseous, and no diamond or diamond-like carbon will be formed. To obtain diamond, the temperature for precipitation is preferably from 600° to 1,200° C.

Now, the method of the present invention will be described with reference to the drawing. FIG. 1 is a diagrammatical view of an apparatus used for carrying out the method of the present invention. In FIG. 1, reference numeral 1 designates concentric triple tubes, numeral 2 designates a reactor, numeral 3 designates a substrate, numeral 4 designates a cooling gas inlet, numeral 5 designates an ignition plug, numeral 6 designates a sheath gas discharge ring, numeral 7 designates a waste gas treating apparatus, and numeral 8 designates a vacuum pump.

From the respective tubes of the concentric triple tubes 1 (made of quartz), fuel gases for combustion and, simultaneously or subsequently, the organic compound or the carbon material, are introduced into the reactor 2, and the ignition plug 5 is actuated for ignition to generate a high temperature combustion flame and to decompose, evaporate and dissociate the organic compound or the carbon material. Into excited carbon thus formed, hydrogen is introduced from the sheath gas discharge ring 6 in the above specified amount by volume relative to the carbon. In order to prepare a diamond or diamond-like carbon film, the substrate 3 is disposed in the reactor 2, and a cooling gas is introduced from the cooling gas inlet 4 to control the temperature of the substrate 3 to a level of from 600° to 1,200° C. to precipitate a diamond film on the substrate 3, or at a temperature of from 600° to 1,700° C. to precipitate a diamond-like carbon film on the substrate 3. To obtain diamond or diamond-like carbon in a powder form, the substrate 3 is removed, and the precipitation of diamond or diamond-like carbon is conducted in a vapor phase at the above temperature.

According to the method of the present invention, a combustion flame of a hydrocarbon, hydrogen or a gas mixture thereof and oxygen, is used to decompose, evaporate and dissociate the organic compound or the carbon material to form excited carbon, whereby it is unnecessary to use such an expensive apparatus as required by the conventional methods. Further, the forming rate of diamond or diamond-like carbon is as high as from 0.1 to a few $\mu$m/min or a few tens $\mu$m/min.

EXAMPLE 1

By using the apparatus as shown in FIG. 1, 10 l/min of oxygen was supplied from the center tube of the quartz triple tubes, 10 ml/min of propane gas from the intermediate tube of the triple tubes and 2 ml/min of methane was supplied from the outer tube. The feed gas was ignited, and a combustion flame of about 3,000° C. was generated. Further, 50 l/min of hydrogen was introduced as sheath gas from the discharge ring 6. A molybdenum substrate having a diameter of 20 mm was placed on a water-cooled holder, and the reaction was conducted by positioning the substrate at a location where the substrate surface was 1,200° C. as measured by a photo thermometer, for 10 minutes. After the reaction, the molybdenum substrate cooled to room temperature, was taken out and examined to find that a grayish polycrystal film having a thickness of about 10 $\mu$m was formed. From the X-ray diffraction and the Raman spectrum, the film was confirmed to be diamond.

EXAMPLE 2

In the same manner as in Example 1, 2 l/min of oxygen was supplied from the center tube, 10 l/min of hydrogen was supplied from the intermediate tube and 100 ml/min of methane was supplied from the outer tube. The fuel gas was ignited, and a combustion flame of 1,500° C. or higher was generated. Further, 5 l/min of hydrogen was supplied as sheath gas. A molybdenum substrate having a diameter of 20 mm was placed on a water-cooled holder, and the reaction was conducted by positioning the substrate at a location where the substrate surface was 1,000° C. as measured by a photo thermometer, for 10 minutes. After the reaction, the substrate cooled to room temperature, taken out and examined to find that a diamond film having a thickness of 35 $\mu$m was formed.

EXAMPLE 3

In the same manner as in Example 1, 4 l/min of oxygen was supplied from the center tube, 10 l/min of hydrogen was supplied from the intermediate tube, and 40 ml/min of methane was supplied from the outer tube. The fuel gas was ignited, and a combustion flame of 1,500° C. or higher was generated. A space was preliminarily determined at which a substrate would be 1,200° C. Then, without placing the substrate, 10 l/min of hydrogen was supplied as a cooling gas in a cylindrical fashion along the inner wall. After the reaction for one hour, 0.03 g of grayish powder deposited on the wall and the bottom of the reactor, was recovered and examined to find that it was diamond having a particle size of about 0.1 $\mu$m.

EXAMPLE 4

In the same manner as in Example 1, 20 l/min of oxygen was supplied from the center tube, 10 l/min of propane gas was supplied from the intermediate tube, and 18 l/min of methane was supplied from the outer tube. The fuel gas was ignited, and a combustion flame of about 3,000° C. was generated. Further, 50 l/min of hydrogen was supplied as sheath gas. A molybdenum substrate having a diameter of 20 mm was placed on a water-cooled holder, and the reaction was conducted by positioning the substrate at a location where the substrate surface was 1,100° C. as measured by the photo thermometer, for 10 minutes. After the reaction, the molybdenum substrate cooled to room temperature, was taken out and examined to find that a blackish gray diamond-like carbon film having a thickness of about 10 $\mu$m was formed. From the X-ray diffraction and the Raman spectrum, the film was confirmed to be diamond-like carbon.

EXAMPLE 5

In the same manner as in Example 1, 10 l/min of oxygen was supplied from the center tube, 10 l/min of methane was supplied from the intermediate tube, and 8 l/min of hydrogen was supplied from the outer tube. The fuel gas was ignited, and a combustion flame of 1,500° C. or higher was generated. Further, 5 l/min of hydrogen was supplied as sheath gas. A molybdenum substrate having a diameter of 20 mm was placed on a water-cooled holder, and the reaction was conducted by positioning the substrate at a location where the substrate surface was 1,000° C. as measured by a photo thermometer, for 10 minutes. After the reaction, the substrate cooled to room temperature was taken out and examined to find that a diamond-like carbon film having a thickness of 35 μm was formed.

EXAMPLE 6

In the same manner as in Example 1, 10 l/min of oxygen was supplied from the center tube, 5 l/min of methane was supplied from the intermediate tube, and 10 l/min of hydrogen was supplied from the outer tube. The fuel gas was ignited, and a combustion flame of 1,500° C. or higher was generated. A space was preliminarily determined at which the temperature of a substrate would be 1,200° C. Without placing the substrate, 10 l/min of hydrogen was supplied as a cooling gas in a cylindrical fashion along the inner wall. After the reaction for one hour, 0.1 g of blackish gray powder deposited on the wall and the bottom of the reactor, was recovered and examined to find that the powder was diamond like carbon having a particle size of about 0.1 μm.

What is claimed is:

1. A method for preparing diamond or diamond-like carbon, which comprises exciting carbon by decomposing, evaporating and dissociating an organic compound or a carbon material in a combustion flame of at least 600° C. of a hydrocarbon, hydrogen or a mixture thereof and oxygen gas or air, mixing thereto hydrogen in an amount of at least one time by volume the amount of carbon, and maintaining the mixture at a temperature of from 600° to 1,700° C. to precipitate diamond or diamond-like carbon.

2. The method according to claim 1, wherein the mixture of excited carbon and hydrogen is blown against a substrate heated at a temperature of from 600° to 1,700° C. to precipitate diamond or diamond like carbon on the substrate.

3. The method according to claim 1, wherein hydrogen is mixed to excited carbon in an amount of from 1 to 45 times by volume the amount of the carbon to obtain diamond like carbon.

4. The method according to the claim 1, wherein hydrogen is mixed to excited carbon in an amount of at least 50 times by volume the amount of carbon, and the mixture of excited carbon and hydrogen is heated at a temperature of from 600° C. to 1,200° C., to obtain diamond.

* * * * *